United States Patent [19]

Bobeck

[11] 4,143,419

[45] Mar. 6, 1979

[54] MAGNETIC BUBBLE MEMORY WITH SINGLE LEVEL ELECTRICALLY-CONDUCTING, DRIVE ARRANGEMENT

[75] Inventor: Andrew H. Bobeck, Chatham, N.J.

[73] Assignee: Bell Telephone Laboratories, Incorporated, Murray Hill, N.J.

[21] Appl. No.: 857,921

[22] Filed: Dec. 6, 1977

[51] Int. Cl.² .............................................. G11C 19/08
[52] U.S. Cl. .......................................... 365/19; 365/2; 365/20; 365/36; 365/37
[58] Field of Search ..................... 365/2, 19, 20, 36, 37

[56] References Cited

U.S. PATENT DOCUMENTS 3,967,002  6/1976  Almasi et al. ........................... 365/15

FOREIGN PATENT DOCUMENTS 562865  6/1977  U.S.S.R. ...................................... 365/2

OTHER PUBLICATIONS

AIP Conference on Magnetism & Magnetic Materials-No. 24, Dec. 3-6, 1974, pp. 550-551.

*Primary Examiner*—James W. Moffitt
*Attorney, Agent, or Firm*—Herbert M. Shapiro

[57] ABSTRACT

A conductor-access magnetic bubble memory is realized with a single electrically-conductive film for the propagation of bubbles. The film is characterized by sequences of apertures in the film. The sequences define paths for bubble movement in response to controlled current pulses. Ion-implanted regions offset with respect to the aperture edges ensure unidirectional bubble movement along the paths.

10 Claims, 8 Drawing Figures

MAGNETIC BUBBLE MEMORY WITH SINGLE LEVEL ELECTRICALLY-CONDUCTING, DRIVE ARRANGEMENT

FIELD OF THE INVENTION

This invention relates to magnetic bubble memories and more specifically to such memories in which the movement of bubbles is responsive to fields generated by current pulses applied to a pattern of electrically-conducting material adjacent the layer of material in which the bubbles move.

CROSS REFERENCE TO RELATED APPLICATIONS

The present application is related to patent applications, Ser. Nos. 857,919, 857,920, and 857,925, filed Dec. 6, 1977 for A. H. Bobeck.

BACKGROUND OF THE INVENTION

Magnetic bubble memories are well known in the art. Two well-known techniques for moving magnetic bubbles in such memories are commonly referred to as "conductor-access" and "field-access" drive arrangements. The conductor-access type bubble memory is described in A. H. Bobeck et al., U.S. Pat. No. 3,460,116, issued Aug. 5, 1969. The field-access type memory is described in A. H. Bobeck, U.S. Pat. No. 3,534,347, issued Oct. 13, 1970.

The conductor-access type memory comprises a layer of material in which magnetic bubbles can be moved, usually a garnet material grown epitaxially on a nonmagnetic garnet substrate. Several patterns of discrete electrical conductors are formed adjacent the epitaxial layer with appropriate insulating layers therebetween. Typically, three undulating electrical conductors are arranged in positions offset from one another along a path of bubble propagation. The conductors are pulsed in a three-phase manner, as is taught in the above-mentioned patent, in such conductor-access arrangements. The conductor-access type memories can be seen to require intricate electrical conductors which cross one another and are subject to shorts, as well as defects, which render manufacturing yields of such memories low. They also typically require relatively high drive power.

R. F. Fischer, U.S. Pat. No. 3,564,518, issued Feb. 16, 1971, discloses a two-phase conductor-access bubble memory employing two levels of patterned electrically-conducting material and offset permalloy elements for determining directionality of bubble movement. The permalloy elements are disposed to provide low energy or rest positions for bubbles in positions offset from those to which bubbles are moved by a pulse applied to one of the conducting levels. Thus, the permalloy is operative as a "third-phase" conductor would be if it were present.

Similarly, U.S. Pat. No. 3,693,177, issued Sept. 19, 1972, and U.S. Pat. No. 3,678,479, issued July 18, 1972, disclose bubble memories including a single level of electrically-conducting material. Bipolar pulses are applied to the electrically-conducting material which responds to provide, in effect, two phases of the three-phase operation necessary for unidirectional movement of bubbles. In these last two instances, the bubble layer itself is formed into a discrete strip patterned to provide offset rest positions for bubbles and thus operating as a "third-phase" of propagation.

The field-access type memory, on the other hand, employs only a pattern of permalloy elements, or equivalent such as ion-implanted regions, which defines bubble propagation paths in an adjacent bubble layer. The elements are arranged in a plane closely spaced apart from the bubble layer and are responsive to a substantially uniform magnetic field reorienting cyclically in the plane of bubble movement to provide localized moving magnetic pole patterns. The bubbles follow the pole pattern as is well understood. Half-disc, half-chevron, T-bar, and chevron-shaped elements are all familiar geometries characteristic of field-access type memories.

The problem with the field-access arrangement is that relatively costly field coils are necessary to provide a rotating in-plane field to move bubbles and that that field has to be fairly uniform over a relatively large area in which bubble movement occurs. Further, high speed operation is increasingly difficult to achieve because of the difficulty of supplying the requisite volt-ampere product to the coils at increasingly higher frequencies.

On the other hand, conductor-access arrangements require intricate patterns of conductors which, for the only working systems, comprise multilevel circuitry which have relatively high power requirements. Such conductor patterns are too susceptible to short circuits, open circuits, and nonuniformities to allow the realization of circuits of commercially-acceptable size. But conductor-access circuits potentially are capable of relatively high operating speeds because they need not provide uniform fields over large areas. Thus, conductor-access circuits appear attractive. The specific problem then is to realize a conductor-access arrangement for bubble memories which does not succumb to high power requirements or to current nonuniformity problems.

BRIEF DESCRIPTION OF THE INVENTION

The solution to the problem is based on the recognition that an array of low energy or rest positions for bubbles can be defined by, for example, permalloy elements, ion-implanted regions, or surface features such as mesas or recesses in a bubble layer, for use in conjunction with a single electrically-conducting film bearing a pattern of discrete apertures which define paths for bubble movement. The use of a conductor film with apertures positioned to only locally distort a uniform current flow provides the necessary field drive gradients in a most efficient manner. In this context, the apertures are operative in response to current pulses as are permalloy features in the field-access mode responsive to a uniform reorienting in-plane drive field.

In one embodiment, a single electrically-conducting layer, on the surface of an epitaxially-grown garnet layer in which magnetic bubbles propagate, is formed with sets of square apertures, the edges of which are offset with respect to rectangular ion-implanted regions. Rows or apertures and associated regions define paths of bubble propagation. In this embodiment, currents are impressed at contact lands astride the bubble paths so that current flow is transverse to the paths. Bubble movement is realized in response to a pulse train comprising a succession of oppositely poled current pulses, each initiating a phase of movement of bubbles. Each phase is completed by the effect of the associated ion-implanted region. The use of sets of apertures in a single electrically-conducting film for defining the bubble paths enables attractive power and uniformity characteristics to be realized while still ensuring decoupling between adjacent bubble paths.

Thus, in general, a magnetic bubble memory herein is characterized by a film of electrically-conducting material including a plurality of sets of apertures for defining paths for magnetic bubbles in a bubble layer in which bubbles can be moved along with means adapted for providing overall substantially uniform current flow in response to bipolar current pulses applied thereto wherein the memory also comprises means for applying bipolar currents to the last-mentioned means.

An embodiment of this invention wherein current flow is parallel to the paths of bubble movement is disclosed in copending application, Ser. No. 857,925, filed on even date herewith for A. H. Bobeck.

DETAILED DESCRIPTION

Figure 1:
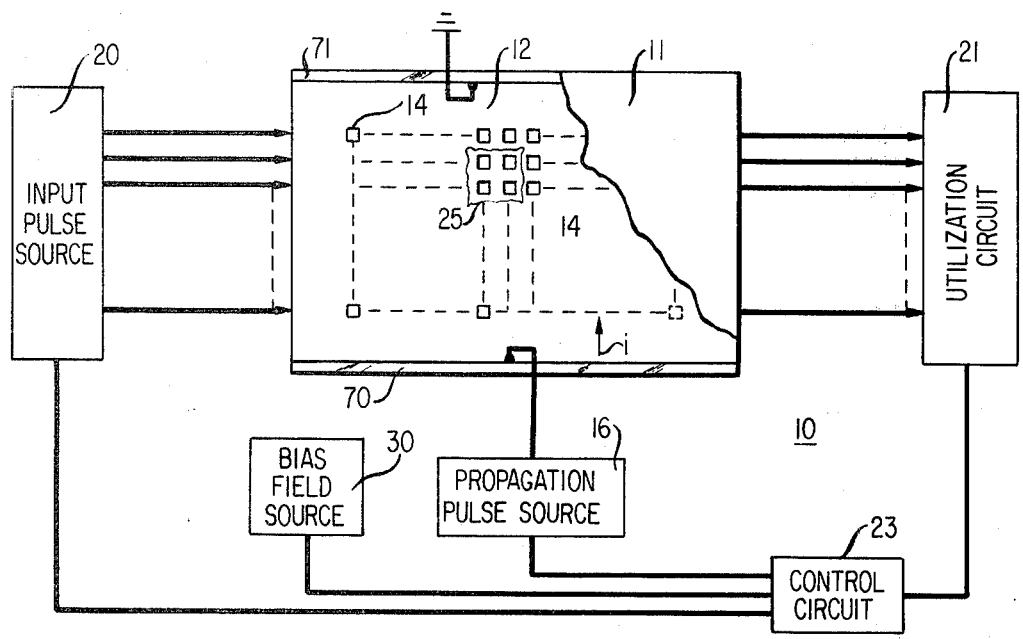
FIG. 1 is a schematic representation of a magnetic bubble memory including a conductor drive arrangement for moving magnetic bubbles.

FIG. 1 shows a magnetic bubble memory 10 including a layer 11 in which magnetic bubbles can be moved. An electrically-conducting layer 12, adjacent layer 11, is shown including a plurality of square apertures 14 in a large central portion of the layer usually occupying the bulk of the layer. A propagation pulse source 16 is connected to one side of the apertured portion and the other side is connected to a reference potential shown as ground in the figure.

A bipolar current (or voltage) pulse from source 16 generates an overall uniform current flow along the columns of apertures as is discussed more fully hereinafter. Bubble propagation, in response, takes place from left to right along the rows of apertures shown coupled to input pulse source 20 to the left and utilization circuit 21 to the right as viewed in the figure. A control circuit for activating and synchronizing the operation of the various sources and circuits is represented by block 23 in FIG. 1. The various sources and circuits may be any such elements capable of operating in accordance with this invention.

Figure 2:
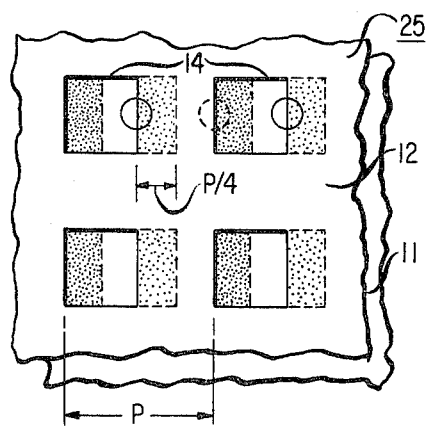
FIGS. 2, 3, and 4 are enlarged views of a portion of the memory of FIG. 1 showing the propagation arrangement and the movement of bubbles therein.

The apertures of FIG. 1 cooperate with rectangular ion-implanted regions, in the illustrative embodiment, to produce bubble movement. The ion-implanted regions are formed in layer 11 and are seen in the enlarged representation of area 25 of FIG. 1 as shown in FIG. 2. If we adopt the convention that one period of the conductor pattern is P, then each ion implant has a width of P/4 along the row as indicated in FIG. 2. A magnetic bubble moved by such a propagation arrangement has a diameter nominally about P/5. The diameter is determined by a bias field characteristic of magnetic bubble devices and supplied by a bias field source represented by block 30 in FIG. 1.

Figure 3:
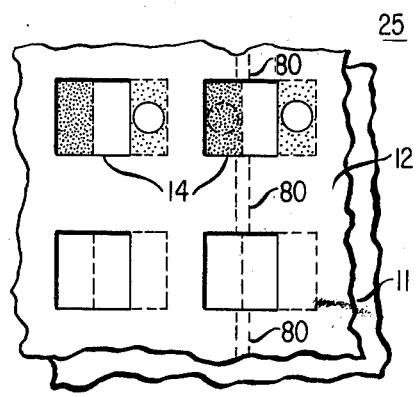
Figure 4:
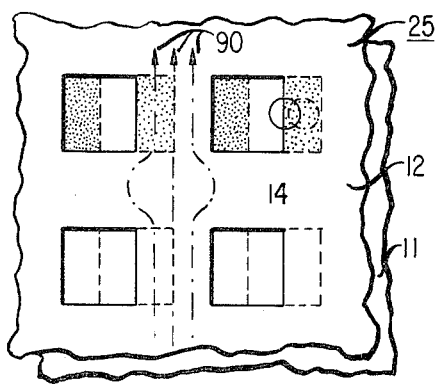
Figure 5:
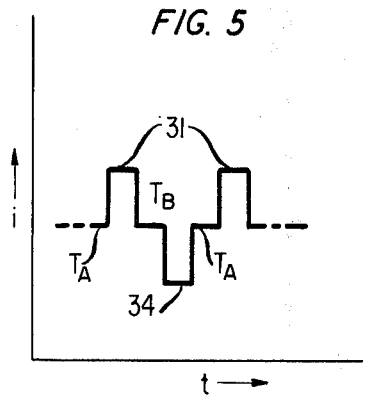
FIG. 5 is a pulse diagram of the operation of the propagation arrangement of FIGS. 1 through 4.

The movement of bubbles in layer 11 is represented in the sequence of FIGS. 2, 3, and 4. FIG. 5 represents the propagation pulse sequence applied by source 16 of FIG. 1 to conducting layer 12 for producing that movement in cooperation with the ion-implanted regions in layer 11. We will employ the convention of representing a bubble as a circle and assume that it seeks the position of a current-produced field in a direction towards the viewer.

In an illustrative operation, say at time $T_A$ in FIG. 5, a pulse 31 of a first polarity is applied to layer 12 by source 16. In response, current flows from bottom to top as indicated by the arrow in FIG. 1. The right hand rule indicates that a positive field is generated at the right edges of the apertures as viewed in FIG. 2. A magnetic bubble, if present, positions itself, accordingly, at that right edge as shown by the solid circles in the figure.

At a subsequent time, shown as $T_B$, in FIG. 5 pulse 31 terminates. A static condition is now present. The bubble positions itself symmetrically with respect to the adjacent ion-implanted region. Such static positions for bubbles are shown by the solid circles in FIG. 3. Subsequently, source 16 applies a pulse 34 of a second polarity to layer 12. Any bubbles present move, in response, left-to-right to the left edge of the apertures in layer 12 as shown by the dotted circle in FIG. 2. At the termination of pulse 34 a second static condition allows movement of bubbles to positions occupied by the dotted circles in FIG. 3.

A next subsequent pulse 31 results in bubble movement to positions represented by the solid circle in FIG. 4. At the termination of that next subsequent pulse, bubbles move to the positions shown by the broken circle in FIG. 4. One illustrative cycle of operation is now complete. Repetition of the pulse sequence results in movement of bubble patterns along the bubble paths to a suitable detector (not shown).

Figure 6:
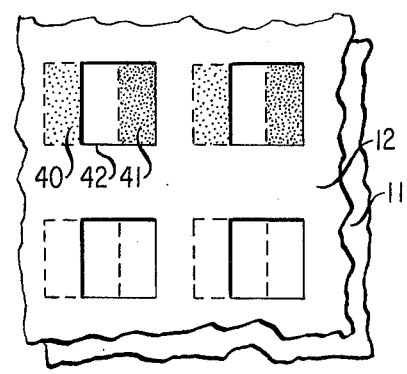
FIGS. 6 and 8 are schematic representations of alternative propagation arrangements in accordance with this invention.

The relative placement of the ion-implanted regions and apertures in the conductor layer determines the direction of movement of bubbles in the arrangement of FIG. 1. Thus, the placement of a row of ion-implanted regions such as 40 and 41, in FIG. 6, beneath layer 12 and exposed through aperture 42, respectively, results in movement of bubbles to the left as viewed in the figure rather than to the right as discussed in connection with FIGS. 2, 3, and 4. Such opposite direction of bubble movement is realized in response to the same pulse sequence described hereinbefore, the location of the ion-implanted regions determining the direction of the offset and thus movement. It should be clear at this juncture that alternate bubble paths in a single memory chip can be formed in a manner to move bubbles in first and second directions simultaneously. Thus, the basic operation of the familiar "major-minor" organization disclosed in P. I. Bonyhard, U.S. Pat. No. 3,618,054, issued Nov. 2, 1971, is realized.

Further elements necessary for some bubble memory operations are "turn" geometries connecting adjacent paths operative to move bubbles in opposite directions. An expansion detector which is fully compatible with the conductor drive arrangement described herein is also helpful.

Figure 7:
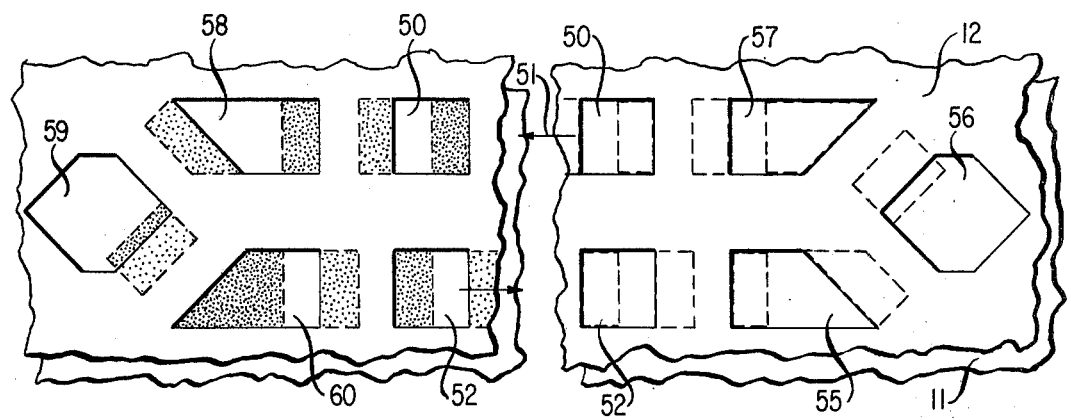
FIG. 7 is a schematic representation of turn geometries for forming circulating loops with the arrangements of FIGS. 1 through 4.

A turn geometry for connecting adjacent paths into a loop for recirculating bubbles counterclockwise is shown in FIG. 7. Note that the position of the ion-implanted regions with respect to the edge of the aperture in conductor layer 12 determines the direction of bubble movement as has been stated hereinbefore. Thus, the top row 50 of apertures in FIG. 7 have the implanted regions to the left of the associated edges and bubble movement is to the left as indicated by arrow 51. In the second row, the apertures 52 are arranged with the ion-implanted regions to the right of the associated edges. Thus, counterclockwise bubble movement occurs with the pulse train of FIG. 5. The turns also are formed with apertures 55, 56 and 57 at the right end of the loop as viewed and with apertures 58, 59 and 60 at the other. The ion-implanted regions are shown on the "downstream" side of the edge of the associated apertures in such instance.

An expansion detector of a compatible geometry is disclosed in copending application, Ser. No. 857,919, of A. H. Bobeck filed concurrently herewith.

Figure 8:
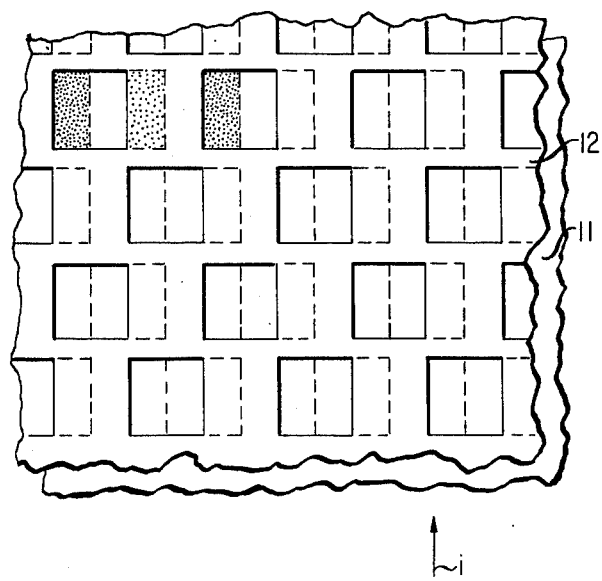

In the embodiments of FIGS. 1 through 7, ion-implanted regions are employed and aligned rows and columns of apertures are used. FIG. 8 shows an arrangement where a plurality of apertures are arranged in offset positions rather than in rows and columns as shown in FIG. 2. Here again, the ion-implanted regions are shown on the downstream side of the edges of the associated apertures. Such an arrangement of apertures permits operation just as described hereinbefore.

The apertures are operative to constrain a substantially uniform current flow into localized regions which are operative not only to move bubbles but also to avoid elongating bubbles into strip domains which are causes of failures in bubble devices. The apertures thus are operative to decouple adjacent bubble paths from one another as has been stated hereinbefore. The apertures further are operative on an otherwise uniform current flow just as permalloy features are operative on an otherwise uniform field in field-access memories. The formation of the apertures, moreover, are nondemanding on the photolithographic processing and obviate the necessity of forming the bubble layer into separate strips.

The use of ion-implanted regions also is merely illustrative herein. Such regions in effect become regions where the magnetization lies in the plane of the layer and are operative to generate magnetic poles which are not always helpful to bubble movement. Alternative known approaches to defining rest positions for bubbles employ permalloy elements, mesas or recesses in the bubble layers, or hard magnetic dots ... etc. Since the position and top view of the rest regions are alike regardless of mode of implementation, the regions shown in the figures as ion-implanted regions are taken also as representative of any such region. What is necessary generally is that the rest positions be located to produce an offset of a bubble from the position to which it is moved in response to a propagate pulse. Further, it is not necessary for the regions to be square or even discrete along the bubble path.

The pulse train employed to cause that bubble movement is bipolar in form. Thus, the apertured conductor layer, in response, provides two phases of unidirectional bubble movement. The offset rest position, in each instance, completes the phase. FIG. 5 shows the pulse train as including pulses separated by zero current levels for some limited duration to emphasize that the offset effect is operative. Actually, the duration of the zero levels can be (long or) vanishingly short and is determined by the designed-in distance a bubble has to traverse to reach a rest position and the mobility of the bubble material in accordance with well-understood considerations.

Also, it is to be noted that current flow in the illustrative embodiment is in a direction transverse to the direction of bubble movement, the current flow overall being substantially uniform throughout film 12. To this end, low impedance, large area contact lands 70 and 71 of FIG. 1 are driven by the drive pulses thus further avoiding the high power requirements and low current uniformity characteristic of prior art conductor-access, bubble memories driven end-on. Source 16 is shown connected to land 70 in FIG. 1 to this end. Land 71 is shown connected to ground in the figure. Alternatively, a distributed or multiple, contact arrangement is possible. In either case, the current flow diverges and converges at the apertures as shown by arrows 90 in FIG. 4. These localized current variations are operative to constrain bubbles as they move them and particularly attractive operating ranges are achieved.

In one specific embodiment, an epitaxial bubble layer of Calcium-Germanium Garnet 1.7 microns thick had a nominal bubble diameter of 1.7 microns. An electrically conducting film of aluminum-copper, 3000 Angstrom units thick, was formed on the surface of the film. Apertures 4 by 4 microns spaced 4 microns apart were aligned with ion-implanted regions 2 by 4 microns in the manner shown in FIGS. 1-4. Ion implantation occurred by exposing a pattern of the surface of the bubble layer to Neon at 100 K.E.V. to achieve an implant of $\frac{1}{4}$ by $10^{14}$ ions per square centimeter to a depth of about 0.2 microns. One-half microsecond drive pulses with zero interpulse spacings were applied as shown in FIG. 5. Operation occurred in a bias field of 250 oersteds. Drive current was less than 10 milliamperes per cell. Operation was achieved over a drive field range of 8 to in excess of 25 milliamperes and a bias field range of 240 to 260 oersteds. Drive power of 3.8 microwatts per cell has been achieved.

It is contemplated that the memory of FIG. 1 may be operated in segments. That is to say, only a portion of the memory need be operated at a time. To implement an arrangement of this type, apertures 14 are interconnected by slots as indicated at 80 in FIG. 3. Such slots are located transverse to apertures which define paths of bubble propagation and are operative to divide the memory into two (or more) sectors. Separate current supplies are used to drive each sector.

In general, a bubble layer is of a material characterized by in-plane preferred directions of magnetization every 120 degrees reflecting three-fold symmetry of the crystallographic structure of the layer. Consequently, it may be advantageous to consider such anisotropy in the design and orientation of the propagation paths in determining shape and orientation of apertures and rest positions. Further, it has been observed that bubbles tend to propagate at a slight angle with respect to a gradient drive field operative to move them. Experimentation has shown that improved margins may result when drive gradients produced by the apertures are slightly canted with respect to the rest positions herein.

The apertures in the electrically-conducting film herein cause localized perturbations in an overall substantially uniform current flow. In order to reduce any overall nonuniformity which may arise in large area memories it may be advantageous to employ an electrically-conducting ground plane as a path for return currents. Alternatively, an electrically-conducting image plane may be employed to constrain field gradients due to overall current flow. In this latter instance, the plane would be spaced so as to not affect fields due to localized perturbations attributed to the apertures in the electrically-conducting film.

Structures of the type herein disclosed are compatible with the provision of an in-plane magnetic field for stabilizing bubble wall dynamics. Such fields are of the order of 200 oersteds and permit even higher frequencies than those described hereinbefore.

What has been described is considered merely illustrative of the principles of this invention. Therefore, those skilled in the art are capable of devising various modifications thereof within the spirit and scope of the invention as encompassed by the following claims.

What is claimed is:

1. A magnetic bubble memory comprising a layer of material in which magnetic bubbles can be moved, a film of electrically-conducting material overlying said layer, said film comprising a plurality of sets of apertures each of said sets defining a path for the movement of bubbles therealong, means associated with each of said apertures for providing rest positions for bubbles offset therefrom, and means for providing a flow of current in said film alternately in first and second directions for moving bubbles to positions offset from associated rest positions.

2. A magnetic memory in accordance with claim 1 wherein said first and second directions are transverse to said paths.

3. A magnetic bubble memory in accordance with claim 2 wherein said means for providing rest positions includes a rest position located downstream along the path of bubble movement from each edge of each of said apertures in said path.

4. A magnetic bubble memory in accordance with claim 3 wherein each of said rest positions comprises an ion-implanted region.

5. A magnetic bubble memory in accordance with claim 2 wherein each of said rest positions comprises a mesa in the surface of said bubble layer.

6. A magnetic bubble memory in accordance with claim 4 wherein each of said ion-implanted regions is coextensive with the transverse dimension of the associated aperture and has a dimension along said path equal to half that of said aperture.

7. A magnetic bubble memory in accordance with claim 3 wherein said means for providing a flow of current includes first and second lands astride said paths and means for connecting to said paths in a manner to provide overall uniform flow of current transverse to said paths in response to current signals applied thereto.

8. A magnetic bubble memory including a layer of magnetic material in which magnetic bubbles can be moved, means for defining rest positions for bubbles in said layer, and electrical conductor means for moving bubbles to positions offset from said rest positions, said last-mentioned means comprising and electrically-conducting film overlying said layer and including sets of apertures therein disposed, when pulsed, to move bubbles to said offset positions along a plurality of paths defined by said apertures.

9. A magnetic bubble memory (10) comprising a layer (11) of magnetic material in which magnetic bubbles can be moved, and rest positions (14) for bubbles in the layer, and electrical conductor means for moving bubbles in the layer, characterized in that the memory includes a film (12) of electrically-conducting material including a plurality of sets of apertures (14) for defining paths for magnetic bubbles in layer 11 along with means (70 and 71) adapted for providing overall uniform current flow in response to bipolar current pulses applied thereto, the memory also comprising means (16) for applying bipolar current pulses to the last-mentioned means for moving bubbles to positions offset from rest positions.

10. A magnetic bubble memory comprising a layer of magnetic material in which magnetic bubbles can be moved, and means for providing rest positions for bubbles in said layer, said memory being characterized by signal-responsive means for providing substantially uniform overall current flow in a plane coupled to said layer, and means for causing a pattern of localized perturbations in said current flow for moving bubbles to positions offset from said rest positions.

* * * * *